(12) United States Patent
Drexl et al.

(10) Patent No.: US 7,619,309 B2
(45) Date of Patent: Nov. 17, 2009

(54) INTEGRATED CONNECTION ARRANGEMENTS

(75) Inventors: Stefan Drexl, Moorenweis-Eismerszell (DE); Thomas Goebel, München (DE); Johann Helneder, Landsham (DE); Martina Hommel, München (DE); Wolfgang Klein, Zorneding (DE); Heinrich Kôrner, Bruckmühl (DE); Andrea Mitchell, München (DE); Markus Schwerd, Holzkirchen (DE); Martin Seck, München (DE)

(73) Assignee: Infineon Technologies AG, Munich (DE)

( * ) Notice: Subject to any disclaimer, the term of this patent is extended or adjusted under 35 U.S.C. 154(b) by 47 days.

(21) Appl. No.: 11/350,518

(22) Filed: Feb. 9, 2006

(65) Prior Publication Data
US 2006/0192289 A1 Aug. 31, 2006

Related U.S. Application Data

(63) Continuation of application No. PCT/EP2004/051569, filed on Jul. 21, 2004.

(30) Foreign Application Priority Data
Aug. 14, 2003 (DE) .............................. 103 37 569

(51) Int. Cl.
 H01L 23/48 (2006.01)
 H01L 23/52 (2006.01)
 H01L 29/40 (2006.01)
 H01L 21/4763 (2006.01)
(52) U.S. Cl. ............... 257/758; 438/618; 257/E23.012; 257/E21.508
(58) Field of Classification Search ......... 257/758, 257/E23.012, E21.508; 438/618
See application file for complete search history.

(56) References Cited

U.S. PATENT DOCUMENTS

| 5,169,680 | A | * | 12/1992 | Ting et al. .................... 438/629 |
| 5,525,544 | A | | 6/1996 | Kariyazono et al. |
| 5,904,556 | A | | 5/1999 | Suzuki et al. |
| 5,969,424 | A | * | 10/1999 | Matsuki et al. ............. 257/768 |
| 6,249,532 | B1 | * | 6/2001 | Yoshikawa et al. .......... 370/486 |

(Continued)

FOREIGN PATENT DOCUMENTS

JP 2000-340569 12/2000

(Continued)

OTHER PUBLICATIONS

Translation of Japanese Office Action dated Jun. 16, 2009; Patent Application No. 2006-523006.

*Primary Examiner*—Kiesha L Rose
*Assistant Examiner*—Igwe U Anya
(74) *Attorney, Agent, or Firm*—Brinks Hofer Gilson & Lione (57) ABSTRACT

A connection arrangement having an outer conductive structure arranged at least partly or completely in a cutout of an electrical insulation layer is provided. An inner conductive structure is arranged at the bottom of the cutout on one side of the insulation layer. The inner conductive structure adjoins the outer conductive structure in a contact zone. A contact area is arranged at the outer conductive structure on the other side of the cutout. The contact zone and the contact area do not overlap. The bottom of the cutout is arranged to overlaps at least half of the contact area, to provide a step in the insulation layer at the edge of the cutout outside a main current path between the contact area and the inner conductive structure.

19 Claims, 4 Drawing Sheets

U.S. PATENT DOCUMENTS

| | | | |
|---|---|---|---|
| 6,287,893 B1 * | 9/2001 | Elenius et al. | 438/108 |
| 6,300,234 B1 * | 10/2001 | Flynn et al. | 438/612 |
| 6,429,532 B1 * | 8/2002 | Han et al. | 257/781 |
| 6,451,681 B1 * | 9/2002 | Greer | 438/601 |
| 6,500,750 B1 * | 12/2002 | Shroff et al. | 438/622 |
| 6,559,548 B1 * | 5/2003 | Matsunaga et al. | 257/774 |
| 6,650,002 B1 * | 11/2003 | Toyosawa et al. | 257/637 |
| 6,713,870 B2 * | 3/2004 | Fang | 257/734 |
| 6,720,212 B2 * | 4/2004 | Robl et al. | 438/132 |
| 6,734,047 B1 * | 5/2004 | Daubenspeck et al. | 438/132 |
| 6,768,199 B2 * | 7/2004 | Yoon et al. | 257/758 |
| 6,803,302 B2 * | 10/2004 | Pozder et al. | 438/612 |
| 6,908,841 B2 * | 6/2005 | Burrell et al. | 438/612 |
| 7,247,943 B2 * | 7/2007 | Scheucher | 257/734 |
| 7,294,565 B2 * | 11/2007 | Burrell et al. | 438/582 |
| 7,301,244 B2 * | 11/2007 | Tsutsui et al. | 257/779 |
| 7,397,125 B2 * | 7/2008 | Oda | 257/758 |
| 2002/0016070 A1 * | 2/2002 | Friese | 438/689 |
| 2002/0093098 A1 * | 7/2002 | Barr et al. | 257/751 |
| 2003/0015802 A1 | 1/2003 | Watanabe | |
| 2003/0080428 A1 | 5/2003 | Izumitani et al. | |
| 2004/0032024 A1 * | 2/2004 | Lee et al. | 257/734 |
| 2004/0150112 A1 * | 8/2004 | Oda | 257/758 |
| 2004/0235223 A1 * | 11/2004 | Lai et al. | 438/118 |
| 2005/0093176 A1 * | 5/2005 | Hung et al. | 257/786 |
| 2005/0121804 A1 * | 6/2005 | Kuo et al. | 257/781 |

FOREIGN PATENT DOCUMENTS

| | | |
|---|---|---|
| JP | 2002-313910 | 10/2002 |
| JP | 2003179059 | 6/2003 |
| WO | WO 03/003458 A2 | 1/2003 |

* cited by examiner

INTEGRATED CONNECTION ARRANGEMENTS

PRIORITY AND CROSS REFERENCE TO RELATED APPLICATION

This application is a continuation of International Application No. PCT/EP2004/051569 filed Jul. 21, 2004, which claims priority to German application 103 37 569.4, filed Aug. 14, 2003, both of which are incorporated in their entirety by reference herein.

BACKGROUND OF THE INVENTION

1. Field of the Invention

The invention relates to an integrated connection arrangement, and in particularly to semiconductor components having a substrate, an outer conductive structure remote from the substrate.

2. Description of the Related Art

An integrated circuit arrangement may include an outer conductive structure having a bonding pad with a bonding zone and a test zone. A metallization stratum having vias may be arranged between two metallization strata with interconnects. Current flows in the vias normal to or counter to a normal direction to a main area, but not parallel to the main area or transversely with respect to the normal direction.

Vias may have the following common features:

current flows in the normal direction or opposite to the normal direction to the main area, but not parallel to the main area, arranged with a large part of their cross-sectional area of a cross section parallel to the main area or completely overlapping an underlying interconnect or an overlying interconnect, and sections do not overlap an overlying or underlying interconnect (e.g., sections which are offset with respect to the interconnect) do not influence the function of the integrated circuit arrangement, (e.g., not utilized as an electrically conductive connection that is required for the function of the integrated circuit arrangement).

The fabrication of metallization strata with interconnects and vias, on the one hand, and of metallization strata having exclusively vias, on the other hand, are customary and accepted techniques for producing integrated circuit arrangements. In terms of process engineering, vias of a metallization stratum may have common or similar dimensions. By contrast, interconnects of a metallization stratum have contours that deviate significantly from one another. The length may be a multiple of the width of an interconnect.

Criteria for a metallization layer have increased with advances in technology in the production of integrated circuit arrangements. For example, in bipolar and CMOS technologies, current densities of more than 1, 5 and even 10 milliamperes per square micrometer of bulk cross-sectional area are common. A metallization layer, such as a copper metallization layer, may have low bulk resistance, despite small dimensions for the metallization layer. Since copper surfaces may not be cost-effective or include a fabrication-proven mounting technique, aluminum may be used as a last metallization plane. Aluminum has a lower current-carrying capacity. An aluminum bonding pad may be loaded with lower absolute currents, and is less resistant to electro-migration than a copper structure having similar dimensions.

The bonding pad may have a significant influence on the life time of a final product. Current densities are increasing and smaller test and mounting bonding pads are desirable in light of rising integration density associated with additional functions. Accordingly, current densities per bonding pad will increase further.

Therefore there is a need for an improved connection arrangement having improved electrical properties.

SUMMARY OF THE INVENTION

A via metallization stratum may be arranged under a metallization stratum with the connections, adding spatial steps, such as a dielectric having an oxide, a material having a relative permittivity of less than 3.7, a fluorosilicate glass (FSG), a polyimide or silicon nitride. Steps in the dielectric may lead to a local reduction of the thickness of the conductive layer, and thus to a reduced current-carrying capacity. If metallizations are deposited at these steps, then the layer thickness decreases at the steps on account of process effects to values of, for example, approximately 50% of the layer thickness in planar regions. This, in turn, has the effect that the current density increases at the step. Therefore an increase in current density results due to a geometry or thickness narrowing and hence a locally increased current density.

Aluminum bonding pads over interconnects produced in damascene architecture have been connected to the last damascene wiring plane (e.g., copper) by a via embedded in an oxide layer ("pad via"). The aluminum layer is typically between 600 nm and 1200 nm thick. Current flows independently of the direction by way of the pad via and the oxide edge connected therewith. The region of the planar aluminum area is used for testing and/or as a mounting area, for example for bonding wires or for soldering bonds that are used in a flip-chip technique. An obstacle to underlaying the bonding pad with copper over a whole area is the fact that a copper wiring is disadvantageous on account of the mechanical stability under the region of the aluminum pads which is used for the connection and for testing.

The integrated connection arrangement according to the invention may have include the following features:

a contact zone not overlapping or only partly overlapping the contact area as viewed in the direction normal to the area of the inner conductive structure that adjoins the contact zone between outer conductive structure and inner conductive structure, and the bottom of a cutout which completely or partly contains an outer conductive structure, as viewed in the normal direction, being arranged in a manner such that it overlaps at least half of the contact area or overlaps the entire contact area.

The circuit arrangement may have the effect that a dielectric step at which the current density increases does not arise in the main current path. The main current path has flowing in it, for example, more than 50 percent of the current relative to the total current which flows through the contact area. A small portion of the current flows, for example, via a different current path of the outer conductive structure past the connection arrangement. On account of the current density that is now uniform and no longer increased locally, the reliability of the product increases since electromigration effects are reduced. Moreover, it is possible to produce a barrier in the main current path both in the contact zone between inner conductive structure and outer conductive structure and outside this zone on a planar area, so that local defects scarcely occur in the barrier life. As a result, the lifetime of the integrated circuit arrangement is again increased considerably.

A step may be avoided by removing an oxide between an outer conductive structure and inner conductive structure in a region of the current-carrying zone. The outer interconnect adjoins the inner conductive structure in planar fashion in particular in a current-carrying zone, in particular in a zone with a particularly high current density, between contact area 50 and nearest inner interconnect 22. These measures give rise to numerous technical effects:

- avoiding the critical step in the current-carrying region between contact area 50 and nearest inner interconnect 22,
- increase in the permissible current density with reliability remaining the same or significant gain in reliability with the current density kept constant,
- advantages for the circuit design; by way of example, smaller areas are required for the current conduction,
- apart from a layout change, no change in the previous process sequence is necessary,
- local defects in layers at the step may no longer occur, further improving reliability,
- higher absolute currents may be utilized with reliability remaining the same, leading to more configurational possibilities in the circuit (e.g., a smaller number of connection areas per chip are possible), and
- high mechanical requirements can be fulfilled by the integrated circuit arrangement. The contact area can be mechanically loaded without a barrier layer of a conductive structure or the conductive structure near the substrate being destroyed.

The outer conductive structure may serve in one section as an interconnect for lateral current transport in a metallization stratum. The section may be 10 nm to 100 micrometers long and increases the mechanical stability, relaxes the design and/or leads to a reduction of the number of metallization strata required if the outer metallization stratum is utilized in a targeted manner for wiring and not only for connection.

The inner conductive structure may have a main conductive body or conductive core made of copper or a copper alloy bearing against the contact zone. The conductive core may conduct 90 percent of the current flowing through the conductive structure. The outer conductive structure remote from the substrate contains a main conductive body made of aluminum or an aluminum alloy. Furthermore, the outer conductive structure contains a barrier layer, such as tantalum, titanium, titanium nitride, tantalum nitride or a combination of layers of these materials. The barrier layer may prevent copper from penetrating into the aluminum and the occurrence of volume changes that promote electro-migration and impair the quality of the connection or a bonding connection. The good bonding of aluminum can be combined with the high conductivity of copper.

The outer conductive structure may be covered by a passivation layer or a passivation layer sequence in at least one edge region, such as along its entire edge that is remote from the substrate. The passivation layer may prevent ingress of moisture into the integrated circuit arrangement at the interconnect that is remote from the substrate.

The outer conductive structure may project beyond the contact zone also at a side of the inner conductive structure that is remote from that section of the outer conductive structure that carries the contact area. The overhang is may be 10 nm to 100 nm or more. A reservoir for material that fills voids resulting from electro-migration may be formed. The projecting region may be connected only to the interconnect that is remote from the substrate.

The outer conductive structure may have at least one edge region that bears on the insulation layer such as the entire edge region of the outer conductive structure. The patterning of the outer conductive structure can be facilitated by this measure.

When Chemical Mechanical Polishing ("CMP") methods are used during the production of the metallization strata, the interface may be a planar area. A planar area between the metallization strata may simplify further processing process since reflections may be reduced during exposure of the photomasks.

No metallization stratum that only has structures that, during operation of the integrated circuit arrangement, predominantly conduct current in a normal direction or counter to the direction normal to a main area (e.g., exclusively having vias) is arranged between the outer metallization stratum that is the most remote from the substrate and the nearest metallization stratum to the substrate.

In a method, a metallization stratum near a substrate is produced by a damascene technique with a final planarization step. The damascene technique is suitable for copper interconnects (but not exclusively). As an alternative or in addition, the outer metallization stratum is produced by depositing a layer and subsequently patterning the layer in a photolithographic method. This procedure is suitable in particular for the production of aluminum layers or aluminum-containing layers.

DESCRIPTION OF THE DRAWINGS

Exemplary embodiments of the invention are explained below with reference to the accompanying drawings. Identical, functionally identical, or similar elements and signals are referred to with the same reference symbols in the figures unless stated otherwise.

DESCRIPTION OF THE PREFERRED EMBODIMENTS

Figure 1:
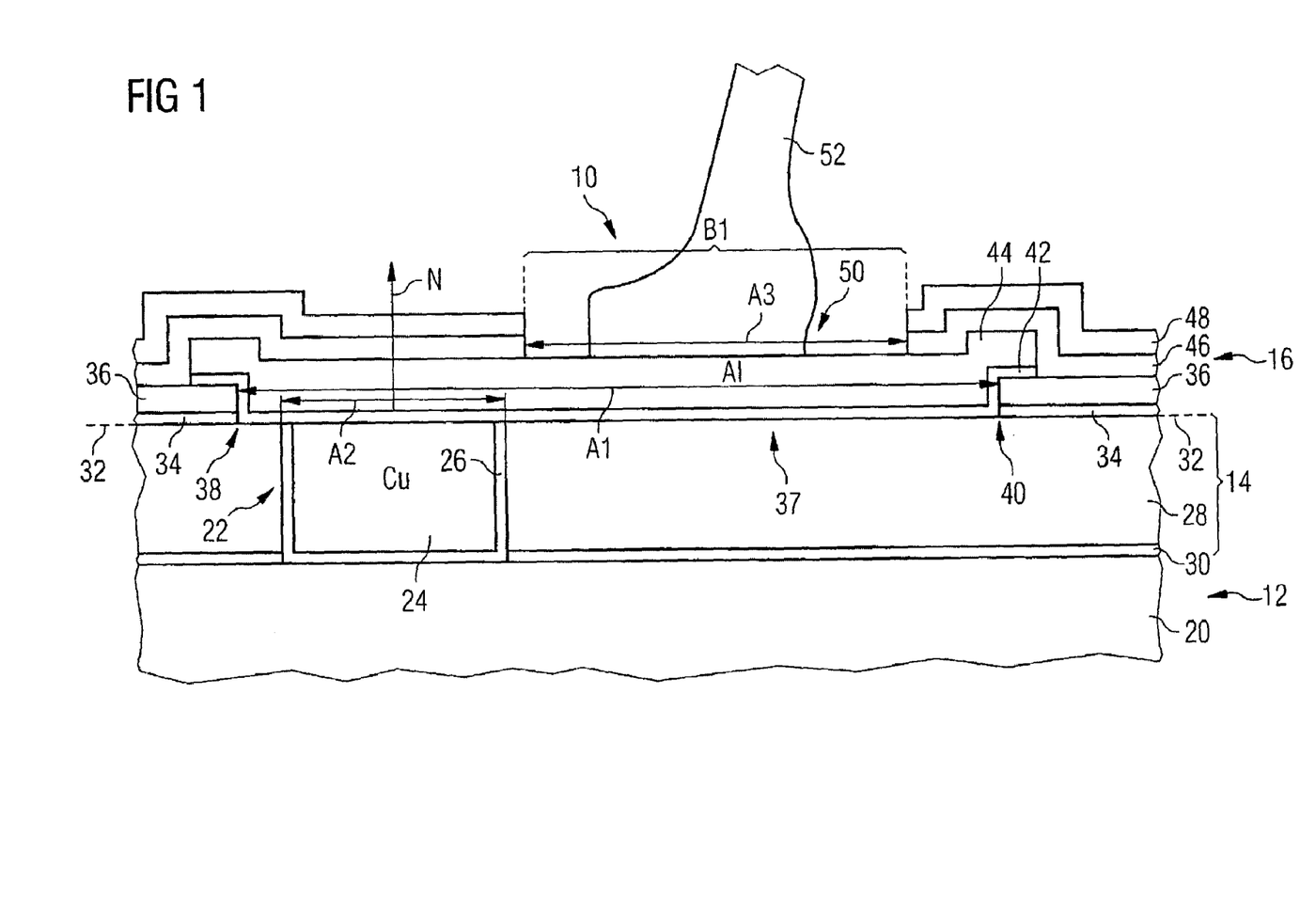
FIG. 1 shows a cross section through an integrated circuit arrangement with copper conductive structure and aluminum bonding connection.

FIG. 1 shows an integrated circuit arrangement 10 having a substrate (not illustrated), such as a silicon substrate, with multiple integrated semiconductor components. The integrated circuit arrangement 10 includes metallization strata 12, 14 and 16. The metallization stratum 12 includes copper vias each having a copper core 18, and an electrically conductive barrier layer. The electrically conductive barrier layer may be tantalum, tantalum nitride, titanium nitride or a combination thereof. The barrier layer may provide a liner or a diffusion barrier that promotes adhesion and orientation during copper deposition. Vertical conductive structures of the metallization stratum 12 are embedded in an insulation material 20. The insulation material 20 may be silicon dioxide.

The metallization stratum 19 includes multiple conductive structures, such as vertical conductive structures and interconnects such as interconnect 22 having a copper core 24. The metallization stratum 14 is primarily an interconnect plane in which vias may also be arranged. The copper core 24 is surrounded toward the bottom and toward the sides by a barrier layer 26 that is associated with the interconnect 22 and has been produced from an electrically conductive material, such as titanium nitride. Electrically insulating insulation material 28, for example silicon dioxide, is arranged between the conductive structures, such as the interconnects, of the metallization stratum 14. The metallization stratum 14 may include an optional stop layer 30 adjoining the metallization stratum 12. The stop layer 30 include an electrically insulating material (e.g., silicon nitride) and provides an etching, or polishing, stop. The stop layer 30 may be around 50 nm thick. The metallization stratum 14 may be between around 200 nm and around 5 μm thick.

A planar interface 32 may be situated between the metallization stratum 14 and the metallization stratum 16. The planar interface may adjoin the copper core 24 in the region of the conductive structure 22. The metallization stratum 16 may include an optional stop layer bearing against the interface 32, or a metal-passivating layer 34 made of electrically insulating material, (e.g. silicon nitride). In an exemplary embodiment, the stop layer is about 50 nm thick. Adjoining the stop layer 34, the metallization stratum 16 contains an electrically insulating insulation layer 36 made of a different material than the stop layer. The electrically insulating insulation layer 36 may be silicon dioxide. Above the conductive structure 22, the insulation layer 36 and the stop layer 34 are penetrated by a cutout 37. The cutout 37 may have a left-hand cutout edge 38 and a right-hand cutout edge 40, so that a contact region B1 may be uncovered. In another exemplary embodiment, the stop layer 34 is used and the insulation layer 36 may not be present.

A distance A1 between the cutout edges 38 and 40 amounts to a multiple of a distance A2 between the sidewalls of the conductive structure 22. The distance A2 is similar to the width of the conductive structure 22. In the exemplary embodiment, the distance A1 may be 90 μm (micrometers) or thereabout and the distance A2 may be 15 μm or thereabout. The conductive structure 22 is situated in the vicinity of the left-hand cutout edge 38. Below the central part and the right-hand part of the cutout with the cutout edges 38 and 40, conductive structures, such as no interconnects may not be present in the metallization stratum 28. For example, interconnects, such as copper interconnects may not be arranged directly between the contact area and a substrate, as viewed in the direction normal to the substrate surface.

The metallization stratum 16 additionally includes regions of an optional electrically conductive barrier layer 42. The conductive barrier may be titanium nitride having a thickness of 50 nm or thereabout.

FIG. 1 illustrates such a region in the region of the cutout 37 with the cutout edges 38 and 40. The region extends at the bottom of the cutout at the interface 32, at the sidewalls of the cutout 37 and in a manner overlapping the edge of the cutout 37 on the insulation layer 36. Each overlap may be around 300 nm. The metallization stratum 16 may further include multiple aluminum structures of an aluminum layer, one aluminum structure 44 of which is illustrated in FIG. 1. The aluminum structure 44 has a layer thickness between about 600 nm and about 1.2 μm, and was patterned substantially simultaneously with the barrier layer 42.

The circuit arrangement 10 additionally contains a passivation layer sequence—adjoining the insulation layer 36—with a lower electrically insulating layer (e.g., a silicon dioxide layer 46) and an upper electrically insulating layer (e.g., a silicon nitride layer 48). The silicon dioxide layer 46 and the silicon nitride layer 48 each have a thickness of about 300 nm in the exemplary embodiment.

Above the region B1, the silicon dioxide layer 46 and the silicon nitride layer 48 are penetrated by a cutout 50, between the edges of which there may be a distance A3 of about 60 μm. The cutout 50 may be rectangular or square. By way of example, a bonding connection 52 is arranged in the cutout 50.

The contact zone of interconnect 22 and barrier layer 42, on the one hand, and the cutout 50, on the other hand, are offset relative to one another with respect to a normal direction N. As viewed in the normal direction N, the bottom of the cutout 37 additionally overlaps the cutout 50. The normal direction N also corresponds to the direction normal to the main area of the semiconductor substrate.

Figure 2:
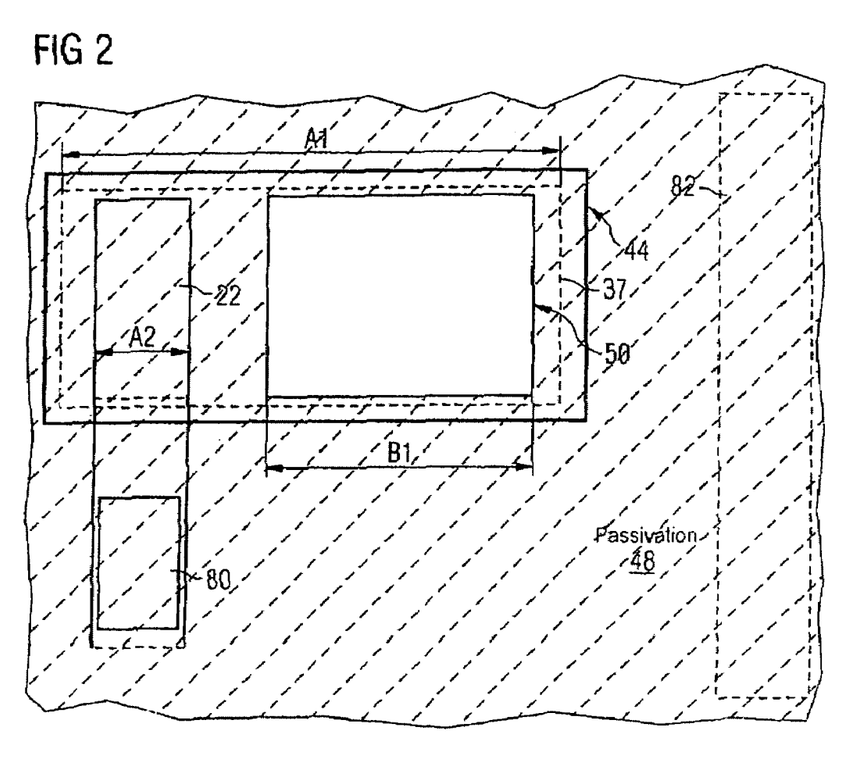
FIG. 2 shows a plan view of an integrated circuit arrangement.

FIG. 2 shows a plan view of the integrated circuit arrangement 10. The layers above the metallization stratum 14 are illustrated in transparent fashion. A line shows the position of the contour of the cutout 37. Below the left-hand quarter of the cutout 37, one half of the interconnect 22 in the metallization stratum 14 may be arranged. The cutout 37 projects partly over the conductive structure 22 so that the conductive structure 22 provides current transport both in the vertical direction and in the lateral direction. At that end of the interconnect 22 that the aluminum structure 44 does not overlap, a via 80 lies in the metallization stratum 12. A further line shows the position of the aluminum structure 44, which bears on the insulation layer 36 along its periphery also outside the cutout 37.

In another exemplary embodiment, the cutout 37 projects over the conductive structure 22 on all sides, by contrast, so that the conductive structure 22 then has the function of a via, such as dashed line 81. In alternative exemplary embodiments, the interconnect 22 is oriented toward other sides from the cutout 37 in the metallization stratum 14. Changes of direction within the metallization stratum 14 are also possible.

As is illustrated in FIG. 2, the cutout 50 for the contact area overlaps the bottom of the cutout 37. In the longitudinal direction of the vertical conductive structure 22, the cutout 37 has an extent of 45 μm, by way of example. FIG. 2 additionally illustrates an interconnect 82 of the metallization stratum 14 that may lie parallel to the longitudinal axis of the vertical conductive structure 22. The interconnect 82 likewise includes a copper core and a diffusion barrier. The interconnect 82 provides for lateral current transport in the metallization stratum 14.

Figure 3:
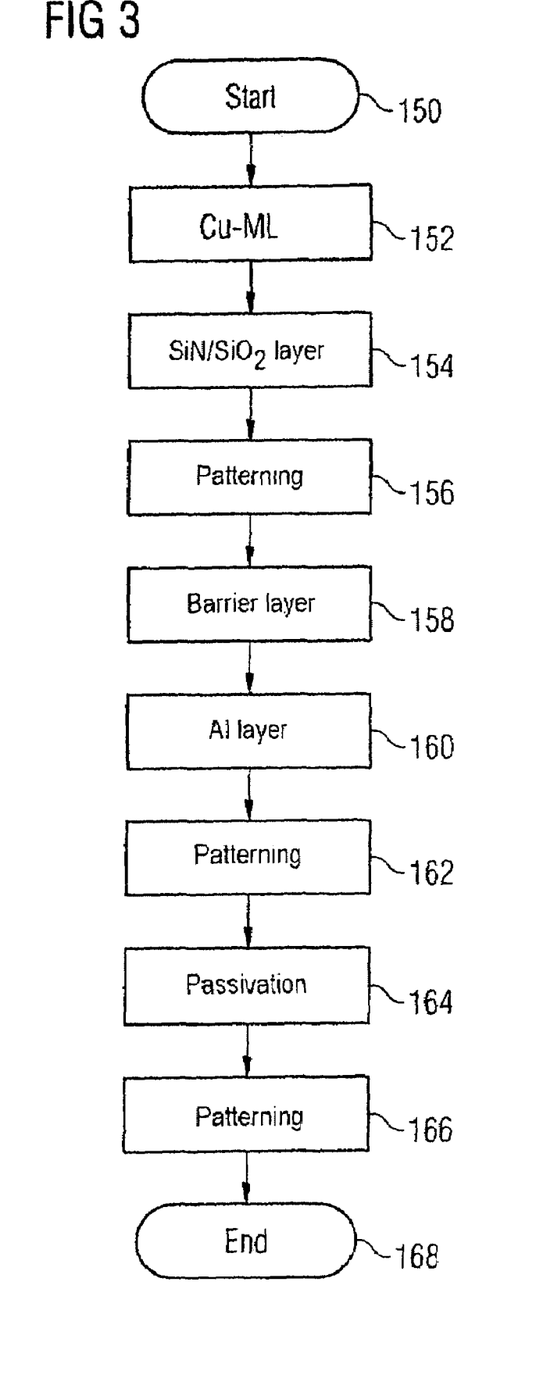
FIG. 3 shows method steps during the production of an integrated circuit arrangement.

FIG. 3 illustrates a flow diagram for a method or process during the production of an integrated circuit, such as the integrated circuit arrangement 10. In step 150, the active electronic components and the metallization strata below the metallization stratum 12 are produced, along with the metallization stratum 12. In step 152, the metallization stratum 14 may be produced with a single damascene process. In another exemplary embodiment, instead of the metallization strata 12 and 14, a metallization stratum is produced with dual damascene process so that the metallization stratum includes a conventional interconnect metallization stratum layer adjoining the metallization stratum 16 and an underlying conventional via metallization stratum layer.

In step 154, the silicon nitride layer 34 and the silicon dioxide layer 36 are applied to the metallization stratum 14 that has been leveled such as with a Chemical Mechanical Polishing ("CMP") method. The silicon nitride layer 34 and the silicon dioxide layer 36 are subsequently patterned in a method step 156. A photoresist layer is applied to the silicon dioxide layer 36 and selectively exposed and developed.

With the aid of the patterned photoresist layer, the silicon dioxide layer 36 is etched in an etching process, such as with the aid of reactive ion etching. The upper part of the cutout 37 may be produced. The etching operation ends when the bottom of the cutout reaches the silicon nitride layer 34, so that the silicon nitride layer 34 maybe essentially un-thinned. The residues of the photoresist layer are subsequently removed.

After the removal of the residues of the photoresist layer, the cutout 37 may be moved into the integrated circuit arrangement 10 with the aid of an anisotropic etching method that removes both oxide and nitride selectively with respect to copper. Both the silicon dioxide layer 36 and the uncovered regions of the silicon nitride layer 34 are thinned in this case. The etching operation may end when the bottom of the cutout 37 reaches the copper core 24 and silicon nitride is substantially removed from the copper core 24. Copper oxide, which reduces the effective conduction cross-section, may not be formed during the incineration of the photoresist of the photoresist layer.

After method step 156, the barrier layer 42 and the aluminum layer from which the aluminum structure 44 is to be produced are deposited, see method steps 158 and 160. The barrier layer 42 and the aluminum layer may be subsequently patterned with a photolithographic method in step 162, the aluminum structure 44 being produced.

In step 164, a silicon dioxide layer 46 serving for passivation and the silicon nitride layer 48 are deposited. With the aid of a photolithographic method, the silicon dioxide layer 46 and the silicon nitride layer 48 are then patterned in a method step 166, the cutout 50 being produced. Optionally, a polyimide layer may be applied to the passivation and be patterned either separately or jointly with the layers 46 and 48.

In step 168, tests of the integrated circuit arrangement may be carried out using the region B1. The integrated circuit arrangement may be subsequently connected via the region B1 with the aid of the bonding wire 52, and the integrated circuit arrangement being cast into a housing.

In the exemplary embodiments explained with reference to FIGS. 1 to 3, two metallization strata 14 and 16 adjoin one another at the interface 32, both of which metallization strata include interconnects that also conduct current in the lateral direction during operation of the integrated circuit arrangement 10. No metallization stratum and no metallization stratum layer that exclusively has structures for the vertical current transport, (i.e., of conductive structures such as vias), lies between the metallization strata 16 and 14 with interconnects. An insulation stratum for insulating conductive structures of one metallization stratum from conductive structures of the other metallization stratum may also be absent.

In other exemplary embodiments, the overlap of the copper core 24 and the aluminum structure 44 is altered. By way of example, the left-hand edge 38 of the cutout 37 bears against the copper core 24 or partially projects into the latter, (i.e. outside the main current path). The overlap of the passivation over the aluminum structure 44 can also be varied.

Figure 4:
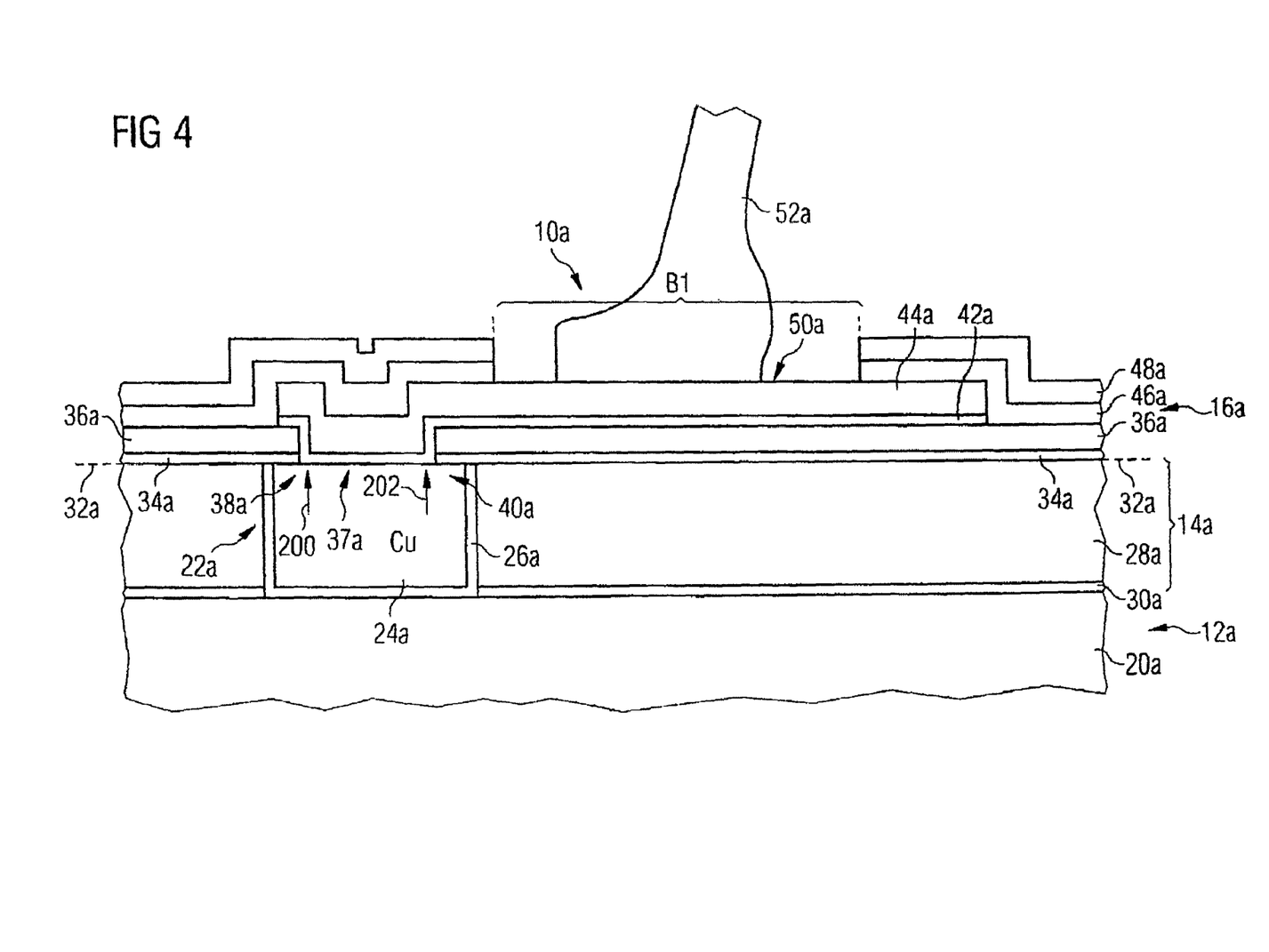
FIG. 4 shows a cross section through an integrated circuit arrangement.

FIG. 4 indicates an alternative position for the edge 38a of a cutout 37a by means of an arrow 200. An arrow 202 indicates an alternative position for the edge 40a of the cutout 37a. The bottom of the cutout 37a does not overlap the contact area B1 in a cutout 50a corresponding to the cutout 50. An oxide step at the edge 40a or at the position illustrated by the arrow 202 adjoins the main current path between the interconnect 22a and the cutout 50a and constricts the main current path. The main current path may conducts more than 90% of the current that also flows through the interconnect 22a. An increase in current density occurs at the step. By moving the edge 40a from the position illustrated by the arrow 202 closer to the position shown in FIG. 1, the harmful influence of the dielectric step, in particular of the oxide step, can be reduced all the more, the closer the right-hand edge 40a is arranged at the position illustrated in FIG. 1. The production steps are always identical in this case, only the layout is altered.

The position of the left-hand edge 38a that is marked by the arrow 200 may be permissible, but not the position of the right-hand edge 40a that is marked by the arrow 202, since the edge 38a does not constrict the main current path between interconnect 22a and contact area 50a.

At the position 200, the left-hand edge 38a of the cutout 40a may form a limited supply reservoir for filling cavities resulting from electro-migration in the aluminum structure 44a if a strong electron current occurs from the interconnect 22a through the aluminum structure 44a to the cutout 50a. The reservoir lies partly on the insulation layer 36a. However, if the edge 38a is arranged at a distance from the interconnect 22a, then an aluminum reservoir advantageously arises within the cutout 37a. The electrical properties of the circuit arrangement 10 are considerably improved, in particular with regard to resistance to electro-migration.

In another exemplary embodiment, the contact areas are only test areas which may be smaller than 20 micrometers by 20 micrometers. By contrast, connection areas for external contacts are larger than 40 micrometers by 40 micrometers. Instead of the external contact possibilities mentioned, it is also possible to use other techniques, such as the flip-chip technique or solder liquid diffusion methods. In the case of the cutout 37 in the dielectric layer 36, no additional measures may be carried out for the rounding of the edges and thus for the rounding of the steps. Steps can nevertheless be avoided in the main current path.

In another exemplary embodiment, the outer conductive structure also contains principally copper that has been planarized by means of a polishing method, so that no overlap of the copper beyond the upper edge of the cutout 37 occurs. In a further exemplary embodiment, all of the metallization strata are fabricated principally from aluminum or from another suitable material. The cutout 37 is arranged in a dielectric layer 36 which is the dielectric layer which is the most remote from the substrate and whose cutouts that are patterned by a photolithographic method are preferably completely filled with integrated conductive structures. After the patterning of the dielectric layer 36, there was no further dielectric layer produced in whose cutouts produced with the aid of a photolithographic method conductive structures of a metallization stratum may be integrated. By way of example, substantially only passivation layers have been applied.

The invention claimed is:

1. An integrated circuit connection arrangement, comprising:

an electrically conductive outer conductive structure being arranged at least partly in a cutout of an electrically insulating insulation layer, the outer conductive structure having at least one edge region adjoining the insulating layer outside the cutout, the at least one edge region being integrally formed with the outer conductive structure;

an electrically conductive inner conductive structure being arranged at a bottom of the cutout toward a first side of the cutout and adjoining the outer conductive structure at a bottom of the cutout in a contact zone;

a contact area arranged at the outer conductive structure on a second side of the cutout, where the contact zone does not overlap the contact area in a direction normal to an area of the inner conductive structure adjoining the contact zone, the bottom of the cutout, in the normal direction, overlapping at least half of the contact area; and an edge of the cutout is arranged at a distance from a main current path of the outer conductive structure, the main current path arranged between the contact area and the inner conductive structure, the edge of the cutout unrestrictive to the main current path, and arranged outside the main current path, where the distance is at least about 10 nm.

2. The integrated circuit connection arrangement of claim 1, where the outer conductive structure comprises an interconnect configured for lateral current flow in a metallization stratum in a first section.

3. The integrated circuit connection arrangement of claim 2, where a length of the first section is at least about 10 nm.

4. The integrated circuit connection arrangement of claim 1, where the outer conductive structure projects beyond the contact zone at a side of the inner conductive structure being remote from the section with the contact area.

5. The integrated circuit connection arrangement of claim 4, where the outer conductive structure projects beyond the contact zone by at least about 10 nm.

6. The integrated circuit connection arrangement of claim 1, where the inner conductive structure comprises a metallization stratum having interconnects configured for lateral current flow in the metallization stratum.

7. The integrated circuit connection arrangement of claim 1, where the outer conductive structure comprises a connection area providing an external connection arrangement.

8. The integrated circuit connection arrangement of claim 7, where the outer conductive structure comprises a connection area providing a bonding connection.

9. The integrated circuit connection arrangement of claim 1, where the inner conductive structure comprises a damascened-formed conductive structure having a main conductive body with at least about a 90% copper mass ratio, and the outer conductive structure includes a main conductive body of aluminum having at least about a 90% aluminum mass ration and a barrier layer at the contact zone, where the barrier layer includes a layer of any one of tantalum, titanium, titanium nitride, tantalum nitride, or a layer sequence of any combination thereof.

10. The integrated circuit connection arrangement of claim 9, further comprising a passivation layer having any one of a silicon dioxide layer, a silicon nitride layer or combination silicon dioxide layer and a silicon nitride layer.

11. The integrated circuit connection arrangement of claim 1, where the outer conductive structure comprises a passivation layer substantially covering the outer conductive layer in at least one edge region along a periphery of the contact area.

12. The integrated circuit connection arrangement of claim 1, where the outer conductive structure includes at least one edge region adjoining the insulation layer outside the cutout proximate an edge region extending around the cutout.

13. The integrated circuit connection arrangement of claim 1, where the contact zone comprises a planar zone, the integrated circuit arrangement being arranged in a semiconductor substrate carrying a plurality of integrated semiconductor components in a main area.

14. A method for producing an integrated circuit arrangement having a connection arrangement, the method comprising:
   forming a plurality of components in a main area of a substrate;
   producing an inner metallization stratum with a plurality of inner conductive structures, at least one inner conductive structure being formed as an interconnect conducting current parallel to the main area during operation of the circuit arrangement;
   adjoining the inner metallization stratum of an outer metallization stratum with a plurality of outer conductive structures, at least one outer conductive structure adjoining an inner conductive structure in a contact zone, at least one of the outer conductive structures has at least one edge region adjoining an insulating layer outside a cutout in the insulating layer, the at least one edge region being integrally formed with the at least one outer conductive structure;
   forming a contact area at the outer conductive structure;
   where the contact zone does not substantially overlap the contact area in a direction normal to the area of the inner conductive structure that adjoins the contact zone, and the contact zone in the normal direction being configured to overlap at least half of the contact area; and
   wherein an edge of the cutout is arranged at a distance from a main current path of the outer conductive structure, the main current path arranged between the contact area and the inner conductive structure, the edge of the cutout unrestrictive to the main current path, and arranged outside the main current path, where the distance is at least about 10 nm.

15. The method of claim 14, comprising forming at least one outer conductive structure as an interconnect which conducts current parallel to the main area during operation of the circuit arrangement.

16. The method of claim 15, further comprising producing the inner metallization stratum using a damascene technique with a subsequent planarization step, and producing the outer metallization stratum by depositing a layer and subsequently patterning the layer using a photolithography.

17. An integrated circuit arrangement, comprising:
   a plurality of components in a main area of a substrate;
   an inner metallization stratum having a plurality of inner conductive structures, at least one inner conductive structure configured as an interconnect conducting current parallel to the main area, where the inner metallization stratum adjoins a plurality of outer conductive structures, at least one outer conductive structure adjoining an inner conductive structure in a contact zone, at least one of the outer conductive structures has at least one edge region adjoining an insulating layer outside a cutout in the insulating layer, the at least one edge region being integrally formed with at least one the outer conductive structure;
   a contact area at the outer conductive structure;
   where the contact zone does not substantially overlap the contact area in a direction normal to the area of the inner conductive structure that adjoins the contact zone, and the contact zone in the normal direction being configured to overlap at least half of the contact area; and
   an edge of the cutout is arranged at a distance from a main current path of the outer conductive structure, the main current path arranged between the contact area and the inner conductive structure, the edge of the cutout unrestrictive to the main current path, and arranged outside the main current path, where the distance is at least about 10 nm.

18. The integrated circuit arrangement of claim 17, comprising at least one outer conductive structure configured as an interconnect conducting current parallel to the main area during operation of the circuit arrangement.

19. The integrated circuit arrangement of claim 17, where the inner metallization stratum comprises a damascene-formed stratum, and the outer metallization stratum includes a photolithography-formed layer.

* * * * *

UNITED STATES PATENT AND TRADEMARK OFFICE
CERTIFICATE OF CORRECTION

PATENT NO.       : 7,619,309 B2
APPLICATION NO.  : 11/350518
DATED            : November 17, 2009
INVENTOR(S)      : Stefan Drexl et al.

It is certified that error appears in the above-identified patent and that said Letters Patent is hereby corrected as shown below:

On the Title Page

Item (75), replace "Kôrner" with --Körner--.

Signed and Sealed this
Tenth Day of May, 2011

David J. Kappos
*Director of the United States Patent and Trademark Office*